United States Patent [19]

Lee

[11] Patent Number: 5,756,648
[45] Date of Patent: May 26, 1998

[54] PHOTOSENSITIVE POLYMIDE MATERIALS FOR ELECTRONIC PACKAGING APPLICATIONS

[75] Inventor: Chung J. Lee, Austin, Tex.

[73] Assignee: Tamarack Storage Devices, Inc., Austin, Tex.

[21] Appl. No.: 548,282

[22] Filed: Oct. 25, 1995

[51] Int. Cl.$^6$ .............................. C08G 73/10; C08L 77/00
[52] U.S. Cl. .............. 528/353; 528/170; 528/172; 528/173; 528/174; 528/179; 528/188; 528/220; 528/229; 528/310; 528/322; 528/350; 524/600; 524/606; 522/65; 522/78; 522/176; 430/270; 430/286
[58] Field of Search ............................ 522/65, 78, 176; 524/600, 606; 528/170, 172, 173, 353, 174, 310, 179, 188, 322, 220, 229, 350; 430/270, 286

[56] References Cited

U.S. PATENT DOCUMENTS

| | | | |
|---|---|---|---|
| 4,996,278 | 2/1991 | Lee | 528/26 |
| 5,053,314 | 10/1991 | Yamaoka et al. | 528/353 |
| 5,310,862 | 5/1994 | Nomura et al. | 528/353 |

*Primary Examiner*—P. Hampton-Hightower
*Attorney, Agent, or Firm*—Baker & Botts, L.L.P.

[57] ABSTRACT

Photosensitive polyimides (Ps-PIM) materials have been synthesized that belong to three families of Ps-PIM materials. Through the use of precursors, various catalytic compositions with differing photosensitivities are provided. The results are Ps-PIM materials having increased photosensitivities at wavelengths longer than approximately 330 to 350 nm and an associated catalytic system that is insensitive to oxygen. A variety of applications, including use in holographic systems, are improved by the present invention.

19 Claims, 4 Drawing Sheets

(a1). Polyamide acids(PAA)

(a2). PAA-Acrylate complexes (a3). Cross linked PAA-Ac (a4). Imidized & Stabilized PIM (b). Ps-Polyamide Ester

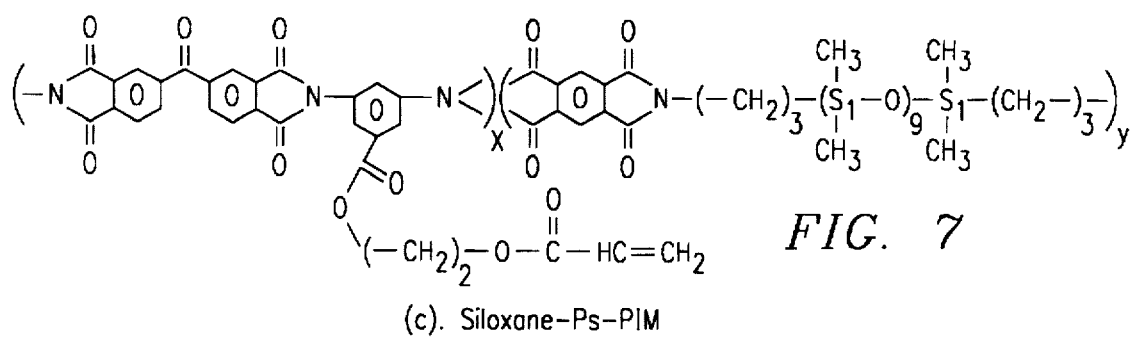
(c). Siloxane-Ps-PIM
FIG. 7
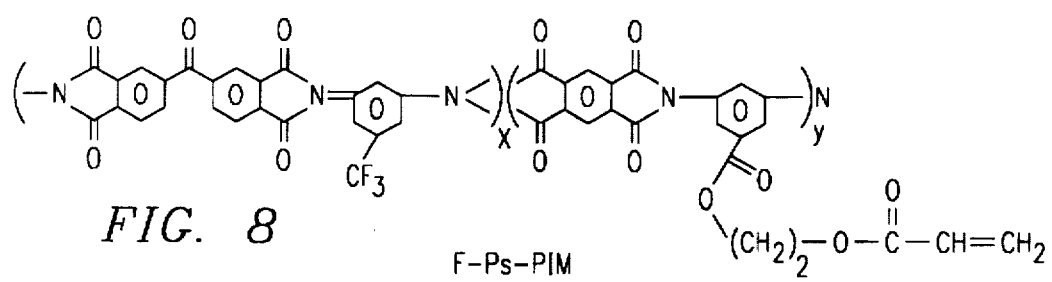
FIG. 8
F-Ps-PIM
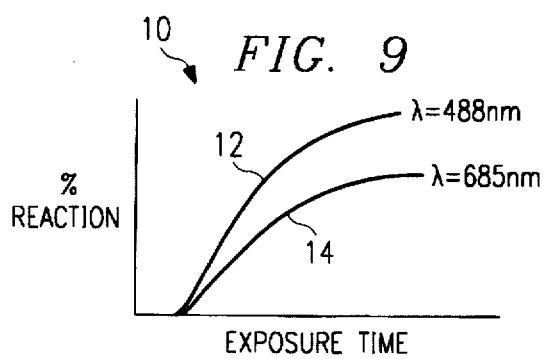
FIG. 9
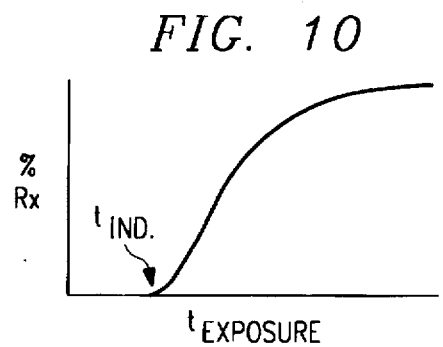
FIG. 10
FIG. 11
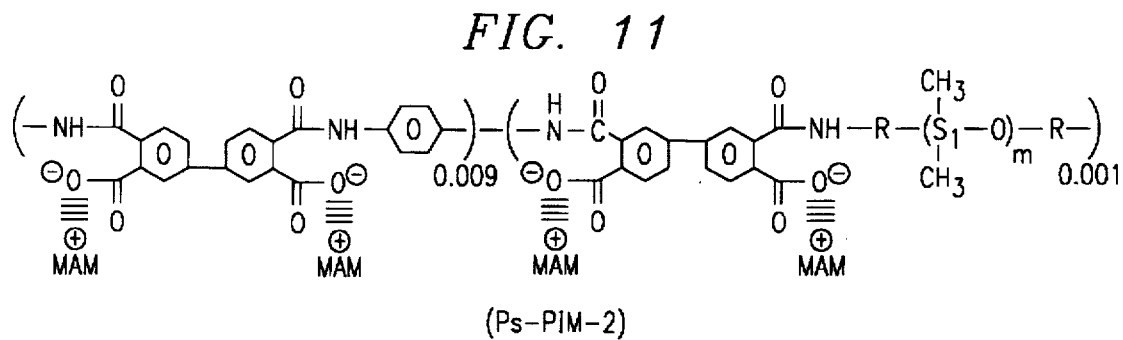
(Ps-PIM-2)

(Ps-PIMm-2)

(Ps-PIM-3)

(Ps-PIMm-3)

I-1

($\lambda$max=380 nm)

(Ps-PIMm-3Si)

FIG. 17

I-3
(λmax=300 nm)

FIG. 18

N-4
(λmax=470 nm)

FIG. 19

I-5
(λmax=385 nm)

FIG. 20

I-7
(λmax=488 nm)

FIG. 21

D1
(λmax=651 nm)

FIG. 22

R=-SOCF4,-PF6,Cl-,-COO,-SbF6

R=SbF6,PF6

OS=DPIBF 5,756,648

1

PHOTOSENSITIVE POLYIMIDE MATERIALS FOR ELECTRONIC PACKAGING APPLICATIONS

BACKGROUND OF THE INVENTION

Polyimides (PIM) are attractive and widely used materials for electronic packaging applications. Moreover, using photosensitive polyimide (Ps-PIM) materials makes it possible to reduce the steps necessary to lay a simple polyimide coating layer. This significantly reduces production costs and makes Ps-PIM materials highly desirable for a wide variety of the electronic packaging applications.

Commercial Ps-PIM materials are classified into two distinct types based on the chemical nature of the cross-linkers in the Ps-PIM. The first type of Ps-PIM materials are cross-linked via methyl groups on the aromatic rings of its backbone structure. For instance, some Ps-PIM materials manufactured by Ciba-Geigy Corporation are pre-imidized polyimides consisting of two pairs of alpha-methyl groups in amino monomers and have the chemical structure appearing in FIG. 1.

When serving as a cross-linker, the methyl groups provide much lower sensitivity to ultraviolet exposure than other groups, such as the acrylates that the second type of Ps-PIMs described below use. The first type of Ps-PIM materials also suffer from poor adhesion due to their high CTE-mismatch with silicon. However, the developed patterns only result in low dimensional shrinkage (within a range of approximately less than 5 to 15 percent) during after-cure heating to remove developers or solvents.

The second type of Ps-PIM material includes three Ps-PIM material families that all use acrylates as the cross-linker. In the two traditional Ps-PIM material families, the acrylate groups either form ionic complexes with the amide acids or are pre-grafted onto the Ps-PIM material's dianhydride monomers. After ultraviolet exposure and development with chemicals, the patterns or cross-linked areas are then heated to imidize the polymer and to decompose all of the acrylate cross-linkers. This post-heat treatment requires temperatures as high as 380° C. to 450° C. and can result in as much as a 50 percent dimensional shrinkage in the developed patterns.

After post-heat treatment and the removal of all acrylates, a Ps-PIM material could theoretically attain all desirable properties identical to yield a fully imidized non-photosensitive polyimide that was synthesized using identical monomers. In principle, then, most useful Ps-PIM materials can be prepared from precursors of materials known as "Low-CTE PIM" materials.

The Low-CTE PIM materials are useful for more demanding applications. Applications such as multichip modules or other electronic packages used by the military or automotive industries often use the Low-CTE PIM materials. However, in practice, Low-CTE Ps-PIM materials can never offer imidized and acrylate-free patterns with xy-CTE values as low as three to six ppm/°C. or with properties matching its non-photosensitive counterparts. This is, in part, due to the fact that there remain some residual carbons or graphite in the resultant PIM patterns.

The third family of Ps-PIM materials may be prepared from pre-imidized, soluble polyimides which carry acrylate pendent groups. For instance, in the pre-imidized, soluble polyimidesiloxanes or fluoro-polyimides, the acrylate groups can be chemically bonded to the carboxylic groups on its amino monomers. These Ps-PIM materials appear in FIG. 7 as siloxane-Ps-PIM and FIG. 8 as F-Ps-PIM. For these pre-imidized Ps-PIM materials, after ultraviolet exposure and development with solvents, the patterns removing residual solvents occur by simply heating while leaving the cross-linked acrylates in the final patterns. Similar to the Ps-PIM materials that Ciba-Geigy Corporation produces, the patterns in these materials shrink only by small percentages. The resultant Ps-PIM material is, therefore, still useful for applications such as chip buffer coating in plastic packages and as dielectric layers in an MCM-L.

Although they provide several technically attractive features, existing Ps-PIM materials have numerous drawbacks. In theory, even with the same quantum yield and identical exposure time, a photoinitiator that absorbs at longer wavelengths will polymerize less acrylates compared to a photoinitiator that absorbs at shorter wavelength. FIG. 9 shows diagram 10 that depicts the percent reaction versus exposure time for the two wavelengths of 488 nm at curve 12 and 685 nm at curve 14, for an equal quantum yield Ps-PIM material. Note that all Ps-PIM products and their polymer precursors, the polyimide acids or polyamide esters absorb very strongly in the short wavelength range of approximately from 200 to 450 nm. Therefore, increasing the quantum yield of traditional ultraviolet photoinitiators mostly results in only marginal success in improving the sensitivity of the Ps-PIM material or shortening the patterning time for thick films.

In fact, for most commercial Ps-PIM materials, the required exposure energy increases exponentially when the thickness of the films increases linearly. This strong thickness dependence makes these materials impractical and undesirable for use in MCM packages or when dielectric layers need to be thicker than 20 to 30 micrometers.

In addition to low transmission of ultraviolet light caused by strong absorption of polyimides or its precursors, other factors also can attribute to low photo-reactivity in Ps-PIM materials. For example, acrylate monomers generally contain at least some inhibitors. The purpose of the inhibitors is to prolong the storage life of the acrylate monomers. The inhibitors, however, also consume free radicals that photoinitiators or acrylates generate during exposure. A disadvantage of this inhibition reaction is that it increases the induction time for all the acrylate-containing resins and, accordingly, slows the photo-reaction in the Ps-PIM material. FIG. 10 shows, therefore, diagram 20 that relates the percentage of reactions, $R_x$, to exposure time, $t_{exposure}$. Induction time, $t_{ind}$, 22 shows that not until some significant time after $t_{exposure}=0$ does the $R_x$ exceed zero. This is due to free radical consumption by the inhibitors.

Another factor that reduces the photo-reactivity of Ps-PIM materials is the amount of pre-dissolved oxygen from air that exists on or in the Ps-PIM materials. Because a triplet oxygen reacts readily with a free radical or an excited triplet dye or photoinitiator, this also increases the Ps-PIM material's induction time.

Still another factor that causes low photo-reactivity in Ps-PIM materials occurs during photopolymerization. During photopolymerization, oxygen that surrounds film formed from Ps-PIM materials diffuses into the film. This oxygen diffusion slows down the acrylate's polymerization rate. Although inert gases such as nitrogen are useful to blanket the Ps-PIM film, there presently exists no practical way to free the Ps-PIM material from inhibition of oxygen.

For these reasons and others, there is the need for a Ps-PIM material and method of forming such Ps-PIM material that produces Ps-PIM materials having greater photo-sensitivities than prior Ps-PIM materials, that are insensitive to oxygen, and that, consequently support forming dielectric patterns with thicknesses beyond the range of 15 microns to 20 microns.

SUMMARY OF THE INVENTION

Accordingly, the present invention provides Ps-PIM materials for electronic packaging applications as well as methods for forming the Ps-PIM materials that substantially eliminate or reduce disadvantages and problems associated with previously developed photosensitive polyimides.

The Ps-PIM materials of the present invention use only an organic solvent as a developer, possess photosensitivities for high quantum yields at wavelengths longer than approximately 330 to 450 nm, and can easily provide patterns thicker than 15 to 20 micrometers. These features provide important technical advantages that are superior to known Ps-PIM materials for electronic packaging and other applications. For instance, in the case of forming a chip buffer coating, traditional polyimide acids are wet etched to expose the pad areas on wafer. The Ps-PIM material of the present invention, on the other hand, avoids potential contamination by ionic impurities presented in alkaline etchants.

In addition, the Ps-PIM materials of the present invention, unlike known Ps-PIM materials, require only moderate fluency (e.g., on the order of only a few hundred mJ/cm$^2$ for making thick patterns of up to 60 micrometers thick. Therefore, the Ps-PIM materials formed according to the present invention are useful as dielectric layers for making MCMs.

The present invention, therefore, includes the synthesis of several polyimide precursors that belong to three families of Ps-PIM materials, including, (a) Ps-PIM materials that form ionic complexes with the amide acids; (b) Ps-PIM materials that are pre-grafted onto its diamine or dianhydride monomers; and (c) Ps-PIM materials that can be prepared from pre-imidized and soluble polyimides. Using polyimide precursors permits evaluating the photosensitivity of various photoreactive compositions. In addition, the photoreactive composition permit evaluating the resolution of patterns with various dimensional and physical properties of a fully imidized PIM. The following detailed description of illustrative embodiments, therefore, includes various embodiments of the present invention that reflect these valuations. Other embodiments are likely to be well within the scope of the present invention.

The present invention provides the technical advantages of a very effective photoreactive composition that also uses a photoinitiating system capable of absorbing primarily at wavelengths longer than that of some selected Ps-PIM materials.

Another technical advantage of the present invention is that it makes it practical to manufacture highly photosensitive dielectric photopolymers which can be patterned even at >60 nm thickness.

Still another technical advantage is that, since the photoreactive composition is not sensitive to oxygen, the resulting Ps-PIM materials exhibit very short induction times and are capable of forming thin films even with the presence of oxygen.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein:

FIGS. 7 and 8 provide the chemical structures of Ps-PIM materials of the present invention;

FIG. 9 provides a diagram of percent reaction versus exposure time associated with the present invention;

FIG. 10 shows a plot of % reactions versus exposure time associated with the present invention;

FIGS. 11 through 15 show the chemical structures of Ps-PIM materials formed according to the present invention; and FIGS. 16 through 24 show the chemical structures for initiators and oxygen scavengers for use with the present embodiment.

DETAILED DESCRIPTION OF THE INVENTION

The various embodiments of materials within the scope of the present invention are described using a convenient notation, Ps-PIM-1, Ps-PIM-2, and Ps-PIM-3. This notation is not intended, nor should it be construed, to limit the scope of the present invention as hereinafter claimed.

Figure 1:
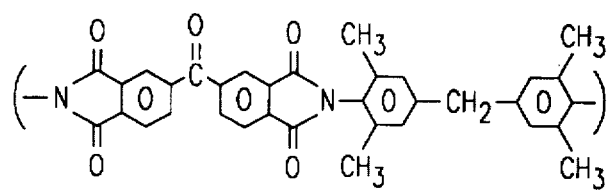
FIG. 1 shows the chemical structure for alpha-methyl groups in amino monomers associated with the present embodiment of the invention.
Figure 2:
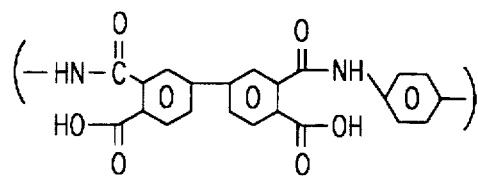
FIG. 2 shows an amino acid precursor associated with the present embodiment of the invention.
Figure 3:
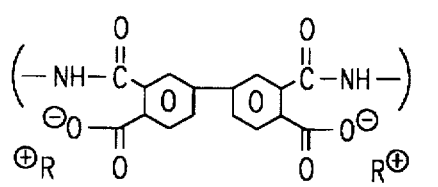
FIGS. 3 through 6 illustrate possible PIM chemical structures applicable to the present invention.
Figure 3:
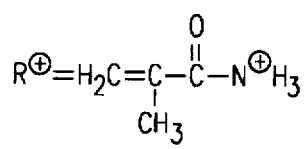
Figure 4:
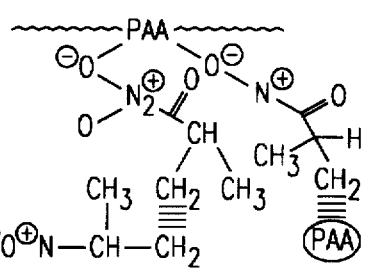
Figure 5:
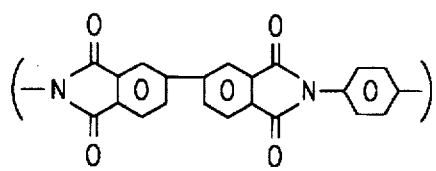
Figure 6:
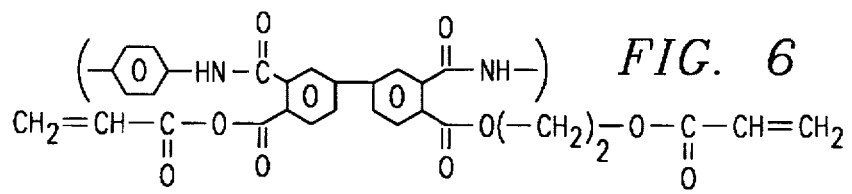

The chemical structure for the material herein designated as Ps-PIM-1 appears in FIG. 3 and characterizes a PIM of the type appearing in FIG. 5 with low xy-CTE from 3 to 6 ppm/°C. FIG. 4 shows the chemical structures for cross-linked PAA-Ac, and FIG. 6 illustrates the chemical structure for Ps-Polyamide Ester formed according to the present invention. The PIM-1 precursor appearing in FIG. 2 was synthesized by reacting 0.01 mole of 1,2,3,4-biphenyl tetracarboxylic dianhydride (BPDA) with 0.01 moles of p-diaminobenzene (p-DAB) in a ten times (by weight) solution of anhydride NMP. The reaction was carried out at room temperature for at least one hour under rigorous mixing. The solution for the Ps-PIM-1 material was obtained by mixing into the above precursor solution 0.015 to 0.020 moles (this being a theoretical amount) of methyl acrylamide (MAM) and a catalytic solution for another 30 minutes.

A second embodiment, here designated as Ps-PIM-2, demonstrates that, on various substrates including silicon, polyimide siloxanes consisting of more than five weight percent of siloxanes, commonly referred to as G9, have much better adhesion than PIM-1. In addition, it also has been shown that absorption of PIM precursor and PIM at longer wavelengths (e.g., with wavelengths greater than approximately 300 nm to 330 nm) can be largely reduced by incorporation of fluoro-containing or siloxane-containing monomers. FIG. 11 shows this chemical structure. However, modification of polyimide structures to reduce sufficient absorption in the ultraviolet ranges requires large amounts (i.e., at least 50%) of siloxanes or fluorinated monomers. Polyimides consist of large amounts of these modifiers resulted in undesirable properties such as high CTE, poor solvent and chemical resistance, and inadequate adhesion.

The Ps-PIM-2 precursor of the present embodiment may be synthesized by modifying the PIM-1 precursor of FIG. 3 with some siloxane diamines, such as G9. Synthesis of the precursor occurs by replacing ten molar percent of p-DAB with G9 under the same conditions described for Ps-PIM-1.

Figure 12:
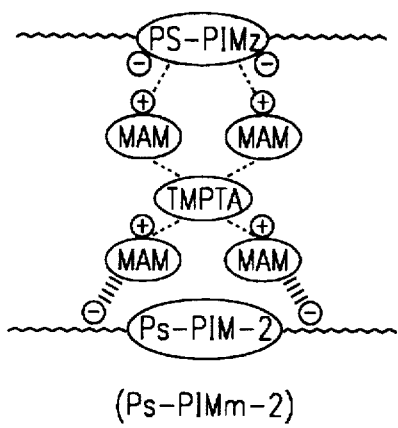

The Ps-PIM-2 material may be obtained by mixing the above precursor with 0.015 to 0.02 moles of MAM and a catalytic solution. This is the clinical structure of FIG. 11. A variation of the Ps-PIM-2 material may be to replace some of the MAM with a tetra-functional acrylate that serves as the cross linker. For instance, 0.005 moles of trimethlolpropane tetra acrylate (TMPTA) may replace 0.005 moles of the MAM. This chemical structure appears in FIG. 12 as the Ps-PIMm-2 material.

Figure 13:
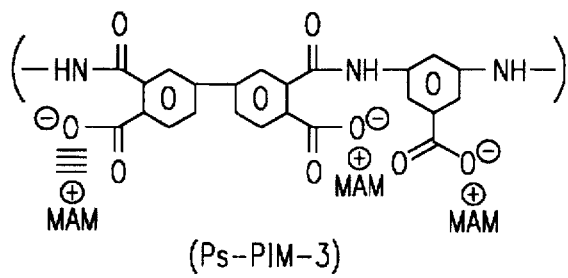

Still another embodiment of the present invention herein has the designation Ps-PIM-3. The precursor of the Ps-PIM-3 arises by reacting 0.01 mole of BPDA with 0.01 mole of 3,5-diamino benzoic acid (3,5-DBA) under the same conditions described before. Mixing 0.015 to 0.02 moles of methyl acrylamide and a catalytic solution into the above solution yields the Ps-PIM-3 precursor. FIG. 13 shows the chemical structure for Ps-PIM-3. In addition, 0.005 moles of TMPTA may replace 0.005 moles of MAM, if desired.

Figure 14:
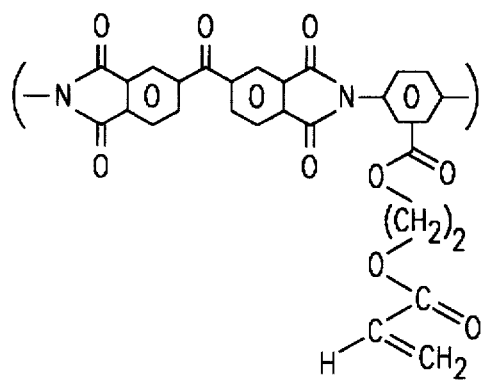

A variation of Ps-PIM-3 replaces all BPDA with 0.01 mole of 1,2,3,4-benzophenone tetracarboxylic dianhydride (BTDA). The resulting PIM-3 precursor then can be fully imidized and still maintain its solubility. The PIM-3 consisting of BTDA can then be further react with a reactive acrylate having the structure, $X=(CH2)n-COO-CR=CH2$, where X is an isocyanato or an OH-group, and R is H or methyl group. The result is a fully imidized Ps-PIM-3 that possesses the chemical structure of FIG. 14. The modified Ps-PIMm-3 makes it possible only to heat the developed patterns to remove excess amounts of the developing solvent. The post-heat treatment will, then result in only 6% to 10% shrinkage of the patterns.

Figure 15:
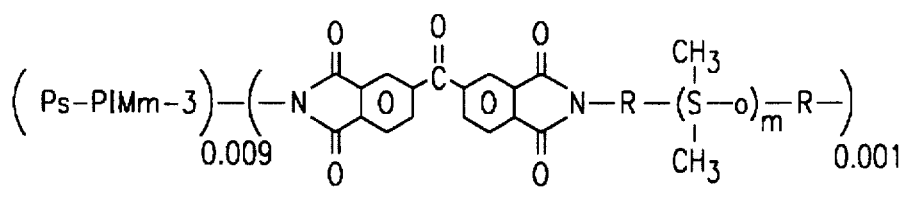

The Ps-PIMm-3 material can be even further modified using 0.0001 moles of G9 to replace 0.001 moles of 3,5-BDA. This results in the Ps-PIMm-3Sis chemical structure appearing in FIG. 15. The Ps-PIMm-3Si material possesses improved adhesion, greater water resistance and lower residual stress over the above Ps-PIM-3 and Ps-PIMm-3 materials. For these reasons, Ps-PIMm-3Si material is especially useful for chip buffer coatings and MCM-L applications where heat and chemical resistance are not essential material characteristics.

The present invention provides as an important feature an effective catalytic system that also uses a photoinitiator capable of absorbing light waves that primarily have wavelengths longer than those of conventional Ps-PIM materials. The catalytic system of the present invention yields highly sensitive photopolymers. The catalytic system is insensitive to oxygen and, consequently, provides holographic photopolymers that exhibit very short induction times. For the present embodiments of the invention, the photosensitive polymers are formulated specifically for high sensitivity to light at wavelengths longer than 350 nm.

The catalytic system of the present invention is useful for all the Ps-PIM materials described above. The catalytic system of the present invention may be prepared by combining at least one chemical from each of the four classes of ingredients: (1) a photoinitiator; (2) a co-initiator; (3) a cationic photoinitiator, and (4) an oxygen scavenger. The specific characteristics of these constituents are described herein in more detail.

A photoinitiator for use with the present invention preferably possesses a moderate to high degree of absorptivity within a range of wavelengths of from 330 nm to as high as 685 nm. Using a commercially available ultraviolet lamp, instead of laser as light source, the preferred maximum wavelength for the photoinitiator should be approximately within the range of 365 to 440 nm.

Figure 16:
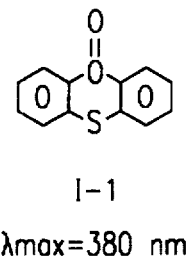

Examples of the chemical structures for the above photoinitiators appear in FIGS. 17 through 21. Note that in FIG. 16, initiator I-1 is photosensitive to light with a maximum wavelength, $\lambda_{max}$, of 380 nm. Photoinitiator I-3 of FIG. 17 possesses a $\lambda_{max}$ of 300 nm. For photoinitiator N-4 of FIG. 18, $\lambda_{max}$ is 470 nm. FIG. 19 shows photoinitiator I-5 which has a $\lambda_{max}$ of 385 nm. The $\lambda_{max}$ for photoinitiators I-7 of FIG. 20 is 488 nm. For photoinitiator D1 of FIG. 21, the $\lambda_{max}$ is 651 nm.

A co-initiator for use with the present invention preferably possesses the general structure, R-NR'R", where R is a hydrocarbon monoradical, R' is a hydrogen or hydrocarbon monoradical and R" is R or a hydrocarbon containing a -COOH group. Examples of the co-initiators are amino acids such as the N-phenyl glycine (NPG), and tertiary amines such as N,N-dimethyl aniline.

A cationic photoinitiator for use with the present invention may be a triphenyl sulfonium or a diphenyl iodonium salt. Examples of the chemical structures for preferred cationic photoinitiators appear in FIGS. 22 and 23.

An oxygen scavenger (OS) that has the chemical structure appearing in FIG. 25 for the oxygen scavenger DPIBF is preferred for the present invention. It is important to note that DPIBF is only effective when D1 is also present. Upon sensitization by a light-excited D1, DPIBF generates reactive species that consume oxygen. Therefore, using D1/DPIBF together in the catalytic system increases the surface cure process for Ps-PIMs.

Having described the composition of the catalytic system for the present invention, the following discussion details its preparation. To make all Ps-PIM precursors very sensitive to ultraviolet exposure, the present embodiment employs a catalytic solution formed according to the following process.

A first step of the preferred process is to prepare solutions of individual ingredients. This includes preparing the following solutions of initiators: (a) a 3% solution of N-4 having the chemical structure appearing in FIG. 18 in DMAc; (b) a 10% solution of I-1 having the chemical structure appearing in FIG. 16 in MEK; (c) a 10% solution of I-3 having the chemical structure appearing in FIG. 17 in MEK; (d) a 10% solution of I-5 having the chemical structure appearing in FIG. 19 in MEK; and (e) a 10% solution of I-7 having the chemical structure appearing in FIG. 20 in MEK. The I-7 MEK solution should be used within 5 hours of preparation. In addition, a further step is to prepare a 20% solution of NPG in ethanol or MeOH, a 4% solution of D1 having the chemical structure appearing in FIG. 21 in methanol, and a 7% solution of an OS having the chemical structure appearing in FIG. 24 for toluene. Furthermore, the following solutions of cationic initiators are needed: (a) a 10% solution of S4, as in FIG. 22, in MeOH or EtOH; (b) a 10% solution of S5, as in FIG. 23, in propylene carbonate and EtOH; (c) 10% solution of S6, also as in FIG. 23, in propylene carbonate and MEK or EtOH.

Assuming the total amount of the acrylates is 5 mM in a Ps-PIM precursor solution, the first catalytic solution, which is herein designated Cat-1, preferably consists of a solution in the amounts of (a) 0.035 g or 3.7 μM solution of D1 as in FIG. 21; (b) 0.03 g or 11.8 μM solution of I-1 as in FIG. 16, or 0.043 g solution of I-3 as in FIG. 17, or 0.04 g solution of I-5 as in FIG. 19, or 0.06 g solution of I-7 as in FIG. 20, or 0.06 g solution of N-4 as in FIG. 18; and (c) 0.237 g or 69.8 μM of S4 as in FIG. 22, or 0.35 g of S5 as in FIG. 23, or 0.35 g of S-6 as in FIG. 23. A second catalytic solution, Cat-2, may be formed by adding another 0.01 or 2.5 μM of the oxygen scavenger DPIBF as in FIG. 24 into the Cat-1 solution.

Demonstrating the formation and application of the Ps-PIM material of the present invention includes the steps of employing processing procedures for Ps-PIMs, exposing the Ps-PIMs, post-baking the Ps-PIMs, developing the Ps-PIMs, and fixing and stabilizing the Ps-PIM patterns. These demonstration steps are described in detail below.

Processing procedures for the Ps-PIM material include establishing incoming material data for quality control, such as the percent solid content versus viscosity. These values should be recorded for every batch. For coating, it is necessary to measure the dry film thickness (µm) versus the spin coating speed (rpm). Also, the dry film thickness should be measured after the following pre-bake step. The pre-bake procedure occurs preferably on a hot plate at a temperature within the approximate range of 85° C. to 90° C. for five to seven minutes, depending on coating thickness. Certain precautions should be taken into consideration to optimize the pre-bake conditions.

For example, the main objective of pre-bake is to remove most of the solvent, so that a Ps-PIM material film is not sticky during the next contact or exposure. However, caution should prevail to not heat the Ps-PIM film too long, because a Ps-PIM film that is too dry or too rigid from overheating retards cross-linking reactions. This will happen and is of particular concern if the glass transition temperature, Tg, of the film is much higher than the exposure temperature for the film, which is normally room temperature. If this occurs, then the effectiveness of the catalytic system will not matter, because its ability to catalyze will be severely limited. Too much solvent left in a film, on the other hand, may compromise the pattern integrity (i.e., the contrast and resolution that the film produces) due to excessive swelling of these patterns. This happens when the exposed areas have only low cross-linking density or when too much solvent exists in the exposed areas. In both cases, monomers in the unexposed areas can easily diffuse into the exposed areas and cause swelling or distortion of the patterns.

A next procedural step for demonstrating the present invention is to establish required fluency or exposure energy versus dry film thickness. For a given film thickness, the minimum required exposure time depends on the intensity of the exposure light. The intensity is predominately determined by the light source-to-film distance from a given ultraviolet lamp. Underexposure causes under cutting or even loss of patterns. Due to high absorption of UV light by Ps-PIM, the light intensity available to the bottom portions of the film can decrease rapidly. If the bottom portions do not have sufficient cross-linking, then the patterns might dissolve away during development. On the other hand, overexposure is uneconomical and may cause excessive shrinkage of the wet patterns that still have high CTE. Too much shrinkage during cure may be detrimental to adhesion and result in losing the pattern loss.

Clearly, therefore, when patterns of various dimensions need to be exposed at the same time, optimal exposure times need to be determined. In practice, the optimal exposure timer may be determined from experimental design to achieve optimal resolutions for all features. Procedures and conditions recommended by the material vendors may, in some instances, also be useful as guidelines.

Due to unique chemistries involved in the catalytic system of the present invention, a post-bake step can further enhance the resolution and contrast of the exposed patterns. As stated above, the cross-linking reactions occur in a polymer matrix having a Tg lower than the exposure temperature. Therefore, post-baking at higher temperatures than room temperature may further enhance the degree of cross-linking. This can only occur, usually, if the reacting species are still reactive after exposure. But this is often not the case for free radicals generated from traditional photoinitiators, because the free radicals more likely than not have already been scavenged by air in a short time after exposure. With the present invention, however, since the catalytic system generates reactive species that are not sensitive to oxygen, it is possible to enhance the degree of cross-linking by performing a post-bake step right after exposure.

To be effective, the post-bake step should be performed within a few minutes after the exposure. It should be performed at temperatures ranging from 50° C. to 60° C. for a period of three to five minutes. Prolonged post-baking at higher temperatures is not recommended, because it results in very dried and compact films and tremendously increases the developing time.

Concerning the development procedural step, in principle any good solvent for the precursors of the Ps-PIM materials of the present invention may serve as a developer. However, it is also important to consider the safety of the processing engineers and this environment when choosing the developer. For polyimide acids or its ester, amide solvents such as dimethyl formamide (DMF), dimethyl acetamide (DMAc) and NMP are good solvents. The dissolution power increases from NMP to DMAc to DMF, or is inversely proportional to their molecular weights or boiling points. Since their toxicity increase in the same order, NMP is highly recommended.

When the precursors are polyamide acids, tetramethyl ammonium hydroxide may also serve as the developer. Tetramethyl ammonium hydroxide is a stronger developer than DMAc and much stronger than NMP. Since tetramethyl ammonium hydroxide is an inorganic base, however, it may cause contamination of chip pads or other metals. Accordingly, unless there is a way to totally rinse off the developer with de-ionized water, tetramethyl ammonium hydroxide should be avoided.

The best method to develop the pattern is to constantly expose the patterns to the developer under mild agitation so that unexposed areas will always be exposed to fresh developer. However, rigorous agitation can break fragile or partially cured patterns. To avoid these problems, one recommended method is the so-called "peddle method" by which a wafer is rapidly and respectively pushed into and pulled out of the developer with jerky motions. Furthermore, developing the Ps-PIM material of the present invention inside an ultrasonic equipment may save time.

The developing time required depends on chemical structures of the particular Ps-PIM material, the pre-bake and exposure conditions, and the Ps-PIM film thickness. In general, from 50 to 200 rinses are required to develop patterns with thickness of 15 to 30 micrometers. This normally takes from 5 to 10 minutes of peddling in the developer.

Fixing and stabilizing of patterns is the next procedural step. The conditions required for fixing and stabilizing patterns are different for the materials Ps-PIM-1, Ps-PIM-2 and Ps-PIM-3. The Ps-PIM-1 material achieves the maximum thermal stability, chemical resistance, and lowest xy-CTE among all the Ps-PIM materials. It is, therefore, most useful for MCM-D applications or where the highest thermal and chemical resistance properties are needed.

To attain its maximum performance, the following heating schedule is recommended. First, heat the Ps-PIM-1 material from 60° C. to 150° C. at a heating rate of approximately 1°C./minute to 3°C./minute. Then, hold Ps-PIM-1 at 150° C. for 30 minutes under forced air. This step removes most of the solvent and imidizes over 60 percent of the solvent. Note that a faster heating rate than 6°C./minute is likely to break patterns, cause bubbles in patterns, result in pattern portions being left-off or not adhering due to high residual film stresses. The next step is to heat the Ps-PIM-1 material from 150° C. to 250° C. at 6°C./minute to 10°C./minute and hold the Ps-PIM material at a temperature of 250° C. for 30 minutes to complete the rest of solvent removal and imidization. The final step in this process is to heat the Ps-PIM material at a rate of approximately from 6°C./minute to 10°C./minute to a temperature of 430° C. and hold the Ps-PIM-1 material at that 430° C. temperature for a period of approximately 30 minutes. This step removes all cross-linkers or acrylates.

The Ps-PIM-2 materials can use the first two heating and hold steps as described for Ps-PIM-1 to complete the stabilization phase. The last heating and holding step, however, is usually not required for MCM-L and chip buffer coating. There is, nonetheless, a special application that may use the above third heating and holding step. The special application recognizes that while most polyimides have a breakdown strength of 5 V/μm or lower, some polyimidesiloxanes can achieve breakdown strengths as high as 10 V/μm. To achieve the maximum breakdown strength, the polyimidesiloxanes need to contain siloxanes to an amount of at least 18 percent to 25 percent by weight of the total polymers. Heating these polyimidesiloxanes to a temperature of approximately 430° C. to 450° C. under a nitrogen atmosphere for a period of more than one hour causes the loss of all hydrogen of the —CH3 groups. The resultant polimidesiloxanes will most likely turn into composites of polyimides and silicone oxide or silicon carbide.

Similarly, at temperatures in the range of from 430° to 450° C., a Ps-PIM material formed of siloxanes will generally lose its cross-linkers or acrylates, as well as all hydrogen and probably some methyl groups from its siloxanes. The resulting polyimidesiloxanes, consequently, will turn into a composite of polyimides and $SiO_2$ or silicon carbide. These end products will exhibit much higher voltage breakdown strengths compared to those of pure polyimides. These fixed patterns can be used as spacers in some high power devices.

The Ps-PIM-3 materials include pre-imidized Ps-PIM or Ps-PIMSi products that need only two steps to be fixed. A first fixing step is to heat the Ps-PIM-3 material from 60° to 150° C. at heating rate of 1°C./minute to 3°C./minute and then hold the Ps-PIM-3 at a temperature of 150° C. for 30 minutes under forced air. This holding period removes most of the solvent. A faster heating rate than 6°C./minute is likely to break patterns, cause bubbles in patterns, result in patterns being left-off or not adhering due to high residual stress. After the first heating step, a second step is to heat the Ps-PIM-3 material from 150° C. to 250° C. at a heating rate of from approximately 6°C./minute to 10°C./minute and hold the Ps-PIM-3 material at a temperature of 250° C. for 30 minutes to completely remove the rest of the solvent.

In the very broadest sense, the photosensitive polyimide formed according to the present invention may be a polyimide precursor having the general formula as below or, through imidization, a soluble polyimide.

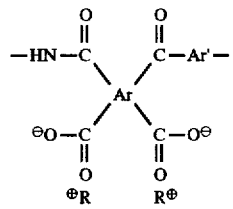

wherein
Ar is an aromatic radical of 6 to 20 carbon atoms,

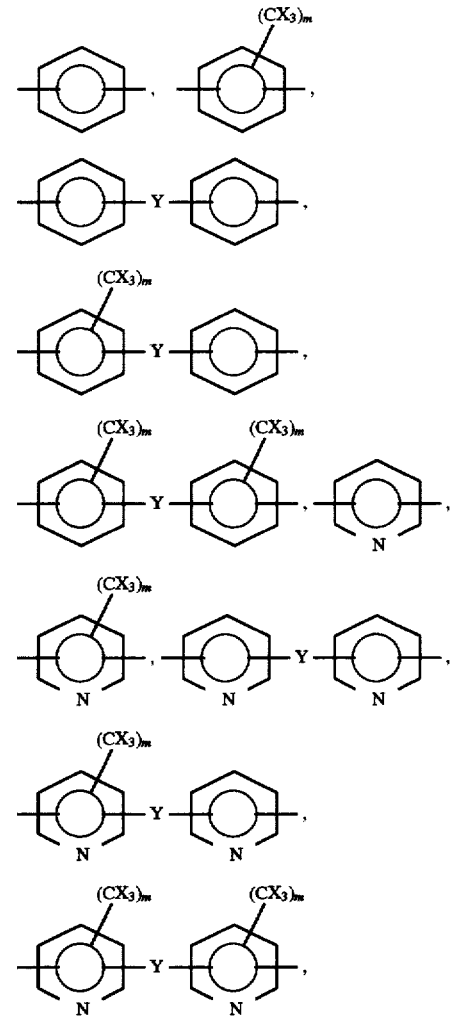

X is a flourine chlorine radical or combinations of flourine and chlorine,
Y=—O—, —S—,

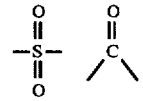

>C $(CX_3)_2$, or —, and
m=0, 1, 2, 3, or 4.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A photosensitive polyimide composition formed by mixing a polyimide precursor with a methylacrylamide solution and a catalytic solution, said photosensitive polyimide composition having the formula:

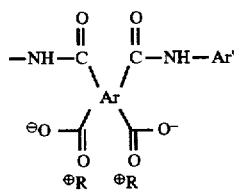

wherein

Ar is an aromatic radical of 6 to 20 atoms, and

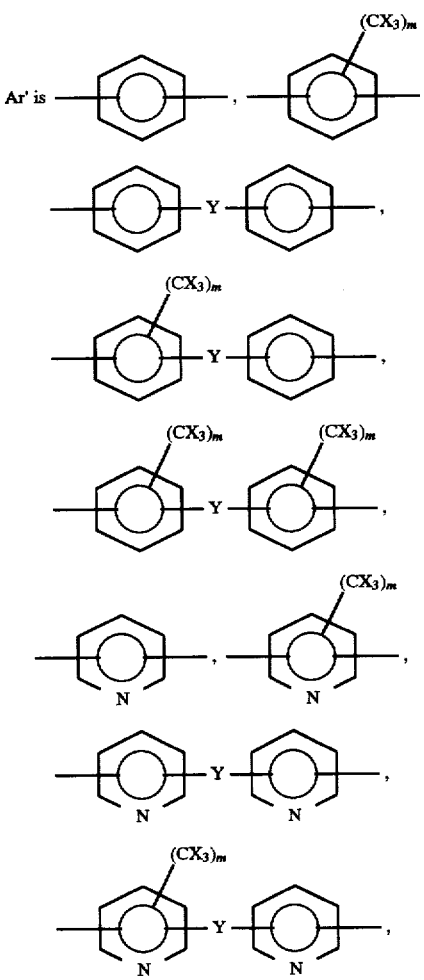

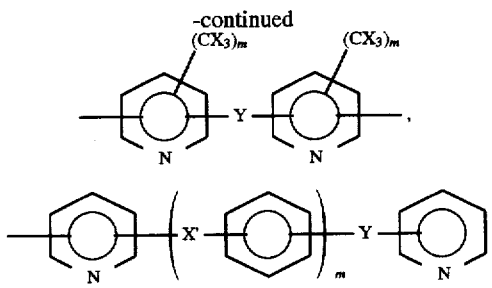

X is a flourine chlorine radical or combinations of flourine and chlorine,

Y is X, —, —O—,

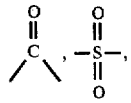

>C(CX3)2, or C(CH3)2, and m is 0, 1, 2, 3, or 4;

and wherein said catalytic solution comprises a photoinitiator, a co-initiator, a cationic photoinitiator, and an oxygen scavenger.

2. The composition of claim 1, wherein said photosensitive polyimide composition comprises a polyimide precursor.

3. The composition of claim 1, wherein said photosensitive composition comprises a soluble polyimide composition.

4. The composition of claim 1, wherein said co-initiator consists essentially of a chemical structure of the form R—NR'R", where R is a hydrocarbon monoradical, R' is a hydrogen or hydrocarbon monoradical and R" is from the group consisting essentially of a hydrocarbon nonradical and a hydrocarbon comprising a —COOH group.

5. The composition of claim 1, wherein said cationic photoinitiator consists essentially of a member from the group consisting of a triphenyl sulfonium and a diphenyl iodonium salt.

6. The composition of claim 1, wherein said oxygen scavenger consists essentially of DPIBF.

7. The composition of claim 1, wherein said cross-linking material comprises a tetra functional acrylate.

8. The composition of claim 1, wherein the polyimide precursor is selected from the group consisting of Ps-PIM 1 precursor, Ps-PIM 2 precursor, Ps-PIM 3 precursor, Ps-PIMm 3 precursor, and Ps-PIMm 3Si precursor, wherein:

Ps-PIM 1 precursor comprises 0.01 moles of 1,2,3,4-biphenyl tetracarboxylic dianhydride (BPDA) reacted with 0.01 moles of p-diaminobenzene (p-DAB) in ten times by weight anhydride NMP at room temperature for at least one hour under rigorous mixing;

Ps-PIM 2 precursor comprises 0.01 moles BPDA reacted with 0.01 moles of a siloxane diamine in ten times by weight anhydride NMP at room temperature for at least one hour under rigorous mixing;

Ps-PIM 3 precursor comprises 0.01 moles BPDA reacted with 0.01 moles 3,5-diamino benzoic acid (3,5-DBA) in ten times by weight anhydride NMP at room temperature for at least one hour under rigorous mixing;

Ps-PIMm 3 precursor comprises 0.01 moles 1,2,3,4-Benzophenone tetracarboxylic dianhydride (BTDA) reacted with 0.01 moles 3,5-DBA in ten times by weight anhydride NMP at room temperature for at least one hour under rigorous mixing; and Ps-PIMm 3Si precursor comprises 0.01 moles BTDA reacted with 0.009 moles of 3,5-DBA combined with 0.001 moles of a siloxane diamine in ten times by weight anhydride NMP at room temperature for at least one hour under rigorous mixing.

9. The composition of claim 8, wherein said photosensitive polyimide composition is Ps-PIM 1 and said methylacrylamide solution comprises 0.015 to 0.02 moles of methylacrylamide, wherein Ps-PIM 1 comprises mixing said Ps-PIM 1 precursor with said methylacrylamide solution and said catalytic solution for approximately one-half of an hour.

10. The composition of claim 8, wherein said photosensitive polyimide composition is Ps-PIM 2 and said methylacrylamide solution is selected from the group consisting of 1) 0.015 to 0.02 moles of methylacrylamide and 2) 0.010–0.015 moles methyacrylamide mixed with 0.005 moles trimethopropane tetra acrylate (TMPTA), and wherein Ps-PIM 2 comprises mixing said Ps-PIM 2 precursor with said methylacrylamide solution and said catalytic solution for approximately one-half of an hour.

11. The composition of claim 8, wherein said photosensitive polyimide composition is Ps-PIM 3 and said methylacrylamide solution is selected from the group consisting of 1) 0.015 to 0.02 moles of methylacrylamide and 2) 0.010–0.015 moles methyacrylamide mixed with 0.005 moles trimethopropane tetra acrylate (TMPTA), and wherein Ps-PIM 3 comprises mixing said Ps-PIM 3 precursor with said methylacrylamide solution and said catalytic solution for approximately one-half of an hour.

12. The composition of claim 8, wherein said photosensitive polyimide composition is Ps-PIMm 3 and said methylacrylamide solution is selected from the group consisting of 1) 0.015 to 0.02 moles of methylacrylamide and 2) 0.010–0.015 moles methyacrylamide mixed with 0.005 moles trimethopropane tetra acrylate (TMPTA), and wherein Ps-PIMm 3 comprises mixing said Ps-PIMm 3 precursor with said methylacrylamide solution and said catalytic solution for approximately one-half of an hour, then further reacting with, a reactive acrylate having a structure of X-(CH2)n-C00-CR=CH2 where X is a compound selected from the group consisting of an epoxy, an isocyanato compound, or an OH- group, and R is a compound selected from the group consisting of hydrogen or methyl.

13. The composition of claim 8, wherein said photosensitive polyimide composition is Ps-PIMm 3Si and said methylacrylamide solution is selected from the group consisting of 1) 0.015 to 0.02 moles of methylacrylamide and 2) 0.010–0.015 moles methyacrylamide mixed with 0.005 moles trimethopropane tetra acrylate (TMPTA), and wherein Ps-PIMm 3Si comprises mixing said Ps-PIMm 3Si precursor with said methylacrylamide solution and said catalytic solution for approximately one-half of an hour, then further reacting with a reactive acrylate having a structure of X—(CH2)n—COO—CR=CH2 where X is a compound selected from the group consisting of an epoxy, an isocyanato compound, or an OH- group, and R is a compound selected from the group consisting of hydrogen or methyl.

14. The composition of claim 1, wherein the photoinitiator comprises a photoinitiator that absorbs primarily at wavelengths longer than that of said photosensitive polyimide.

15. The composition of claim 1, wherein the catalytic solution comprises:

0.035 grams of a 4% solution of D1 in Methanol;

an amount of photoinitiator solution from the group consisting of 0.03 grams of the solution of 10% I-1 in MEK, 0.043 grams of the solution of 10% I-3 in MEK, 0.04 grams of the solution of 10% I-5 in MEK, 0.06 grams of the solution of 10% I-7 in MEK, and 0.06 grams of the solution of 3% N-4 in DMAc;

an amount of cationic solution from the group consisting of 0.237 grams of a 10% solution of S4 in MeOH or EtOH, 0.35 grams of a 10% solution of S5 in propylene carbonate and EtOH, and 0.35 grams of a 10% solution of S6 in propylene carbonate and MEK or propylene carbonate and EtOH; and 0.01 gram of OS as an oxygen scavenger.

16. A process for preparing a photosensitive polyimide composition, comprising:

mixing a polyimide precursor with a methylacrylamide solution and a catalytic solution, wherein said catalytic solution comprises a photoinitiator, a co-initiator, a cationic photoinitiator, and an oxygen scavenger to form a photosensitive polyimide composition that has a relatively high quantum yield at wavelengths greater than approximately 330 nm using a catalytic solution that is not oxygen sensitive.

17. The process of claim 16, further comprising forming the catalytic solution comprising:

0.035 grams of a 4% solution of D1 in Methanol;

an amount of photoinitiator solution from the group consisting of 0.03 grams of the solution of 10% I-1 in MEK, 0.043 grams of the solution of 10% I-3 in MEK, 0.04 grams of the solution of 10% I-5 in MEK, 0.06 grams of the solution of 10% I-7 in MEK, and 0.06 grams of the solution of 3% N-4 in DMAc;

an amount of cationic solution from the group consisting of 0.237 grams of a 10% solution of S4 in MeOH or EtOH, 0.35 grams of a 10% solution of S5 in propylene carbonate and EtOH, and 0.35 grams of a 10% solution of S6 in propylene carbonate and MEK or propylene carbonate and EtOH; and 0.01 gram of OS as an oxygen scavenger.

18. The process of claim 16, wherein the polyimide precursor is selected from the group consisting of Ps-PIM 1 precursor, Ps-PIM 2 precursor, Ps-PIM 3 precursor, Ps-PIMm 3 precursor, and Ps-PIMm 3Si precursor, wherein:

Ps-PIM 1 precursor comprises 0.01 moles of 1,2,3,4-biphenyl tetracarboxylic dianhydride (BPDA) reacted with 0.01 moles of p-diaminobenzene (p-DAB) in ten times by weight anhydride NMP at room temperature for at least one hour under rigorous mixing;

Ps-PIM 2 precursor comprises 0.01 moles BPDA reacted with 0.01 moles of a siloxane diamine in ten times by weight anhydride NMP at room temperature for at least one hour under rigorous mixing;

Ps-PIM 3 precursor comprises 0.01 moles BPDA reacted with 0.01 moles 3,5-diamino benzoic acid (3,5-DBA) in ten times by weight anhydride NMP at room temperature for at least one hour under rigorous mixing;

Ps-PIMm 3 precursor comprises 0.01 moles 1,2,3,4-Benzophenone tetracarboxylic dianhydride (BTDA) reacted with 0.01 moles 3,5-DBA in ten times by weight anhydride NMP at room temperature for at least one hour under rigorous mixing; and Ps-PIMm 3Si precursor comprises 0.01 moles BTDA reacted with 0.009 moles of 3,5-DBA combined with 0.001 moles of a siloxane diamine in ten times by weight anhydride NMP at room temperature for at least one hour under rigorous mixing.

19. The process of claim 18, wherein said photosensitive polyimide composition is a photosensitive polyimide selected from the group consisting of Ps-PIM 1, Ps-PIM 2, Ps-PIM 3, Ps-PIMm 3 and Ps-PIMm 3Si, and wherein:

Ps-PIM 1 comprises mixing said Ps-PIM 1 precursor with said 0.015 to 0.02 moles of methylacrylamide solution and said catalytic solution for approximately one-half of an hour Ps-PIM 2 comprises mixing said Ps-PIM 2 precursor with said methylacrylamide solution where said methylacrylamide solution is selected from the group consisting of 1) 0.015 to 0.02 moles of methylacrylamide and 2) 0.010–0.015 moles methyacrylamide mixed with 0.005 moles trimethopropane tetra acrylate (TMPTA), and said catalytic solution for approximately one-half of an hour;

Ps-PIM 3 comprises mixing said Ps-PIM 3 precursor with said methylacrylamide solution wherein said methylacrylamide solution is selected from the group consisting of 1) 0.015 to 0.02 moles of methylacrylamide and 2) 0.010–0.015 moles methyacrylamide mixed with 0.005 moles trimethopropane tetra acrylate (TMPTA), and said catalytic solution for approximately one-half of an hour;

Ps-PIMm 3 comprises mixing said Ps-PIMm 3 precursor with said methylacrylamide solution wherein said methylacrylamide solution is selected from the group consisting of 1) 0.015 to 0.02 moles of methylacrylamide and 2) 0.010–0.015 moles methyacrylamide mixed with 0.005 moles trimethopropane tetra acrylate (TMPTA), and said catalytic solution for approximately one-half of an hour, then further reacting with a reactive acrylate having a structure of X—(CH2)n—COO—CR=CH2 where X is a compound selected from the group consisting of an epoxy, an isocyanato compound, or an OH-group, and R is a compound selected from the group consisting of hydrogen or methyl;

Ps-PIMm 3Si comprises mixing said Ps-PIMm 3Si precursor with said methylacrylamide solution wherein said methylacrylamide solution is selected from the group consisting of 1) 0.015 to 0.02 moles of methylacrylamide and 2) 0.010–0.015 moles methyacrylamide mixed with 0.005 moles trimethopropane tetra acrylate (TMPTA),and said catalytic solution for approximately one-half of an hour, then further reacting with a reactive acrylate having a structure of X—(CH2)n—COO—CR=CH2 where X is a compound selected from the group consisting of an epoxy, an isocyanato compound, or an OH-group, and R is a compound selected from the group consisting of hydrogen or methyl.

* * * * *